(12) United States Patent
Engelhardt et al.

(10) Patent No.: US 9,627,287 B2
(45) Date of Patent: Apr. 18, 2017

(54) THINNING IN PACKAGE USING SEPARATION STRUCTURE AS STOP

(71) Applicant: Infineon Technologies AG, Neubiberg (DE)

(72) Inventors: Manfred Engelhardt, Villach-Landskron (AT); Edward Fuergut, Dasing (DE); Hannes Eder, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 12 days.

(21) Appl. No.: 14/058,213

(22) Filed: Oct. 18, 2013

(65) Prior Publication Data
US 2015/0108666 A1 Apr. 23, 2015

(51) Int. Cl.
| | | |
|---|---|---|
| *H01L 21/762* | (2006.01) | |
| *H01L 23/28* | (2006.01) | |
| *H01L 21/78* | (2006.01) | |
| *H01L 21/56* | (2006.01) | |
| *H01L 23/31* | (2006.01) | |

(52) U.S. Cl.
CPC .............. *H01L 23/28* (2013.01); *H01L 21/56* (2013.01); *H01L 21/561* (2013.01); *H01L 21/76251* (2013.01); *H01L 21/76254* (2013.01); *H01L 21/76259* (2013.01); *H01L 21/78* (2013.01); *H01L 23/3185* (2013.01); *H01L 2924/0002* (2013.01)

(58) Field of Classification Search
CPC ......... H01L 21/76254; H01L 21/76251; H01L 21/78; H01L 21/76259
See application file for complete search history.

(56) References Cited

U.S. PATENT DOCUMENTS

| | | | |
|---|---|---|---|
| 5,185,292 A | 2/1993 | VanVonno et al. | |
| 7,674,654 B2 | 3/2010 | Brunnbauer et al. | |
| 7,923,350 B2 | 4/2011 | Mahler et al. | |
| 8,749,029 B2 | 6/2014 | Fuergut et al. | |
| 9,064,883 B2 * | 6/2015 | Meyer ................. | H01L 23/3121 |
| 9,275,916 B2 | 3/2016 | Fuergut et al. | |

(Continued)

FOREIGN PATENT DOCUMENTS

| | | |
|---|---|---|
| CN | 103258744 A | 8/2013 |
| CN | 104134607 A | 11/2014 |

(Continued)

OTHER PUBLICATIONS

Thinning and Singulation of Silicon: Root Causes of the Damage in Thin Chips, W. Kroeninger and F. Mariani, Infineon Technologies, Regensburg Germany, pp. 1317-1322 Electronic Components and Technology Conference, 2006.

(Continued)

*Primary Examiner* — Phat X Cao

(57) ABSTRACT

A method of forming a thinned encapsulated chip structure, wherein the method comprises providing a separation structure arranged within an electronic chip, encapsulating part of the electronic chip by an encapsulating structure, and thinning selectively the electronic chip partially encapsulated by the encapsulating structure so that the encapsulating structure remains with a larger thickness than the thinned electronic chip, wherein the separation structure functions as a thinning stop.

13 Claims, 7 Drawing Sheets

(56) References Cited

U.S. PATENT DOCUMENTS

| | | | | |
|---|---|---|---|---|
| 2004/0166651 A1* | 8/2004 | Aspar | ............... | G03F 7/70541 |
| | | | | 438/455 |
| 2005/0200028 A1* | 9/2005 | Farnworth | .......... | H01L 21/3043 |
| | | | | 257/774 |
| 2005/0280119 A1* | 12/2005 | Momoi | ............... | H01L 21/6835 |
| | | | | 257/620 |
| 2009/0014889 A1* | 1/2009 | Barth | ................ | H01L 25/0657 |
| | | | | 257/777 |
| 2010/0044885 A1 | 2/2010 | Fuergut et al. | | |
| 2012/0080690 A1* | 4/2012 | Berger | ................... | H01L 29/02 |
| | | | | 257/77 |
| 2012/0217645 A1* | 8/2012 | Pagaila | ............... | H01L 21/486 |
| | | | | 257/774 |
| 2013/0049205 A1 | 2/2013 | Meyer et al. | | |
| 2013/0207243 A1 | 8/2013 | Fuergut et al. | | |
| 2014/0327003 A1* | 11/2014 | Fuergut | .............. | H01L 21/6835 |
| | | | | 257/48 |

FOREIGN PATENT DOCUMENTS

DE       102012107696 A1    2/2013
DE     10 2014 106 132 A1    11/2014

OTHER PUBLICATIONS

"Materials for Advanced Packaging," D. Lu and C.P. Wong (eds.), 2009, publisher Springer Verlag, ISBN: 978-0-387-78218-8.

\* cited by examiner

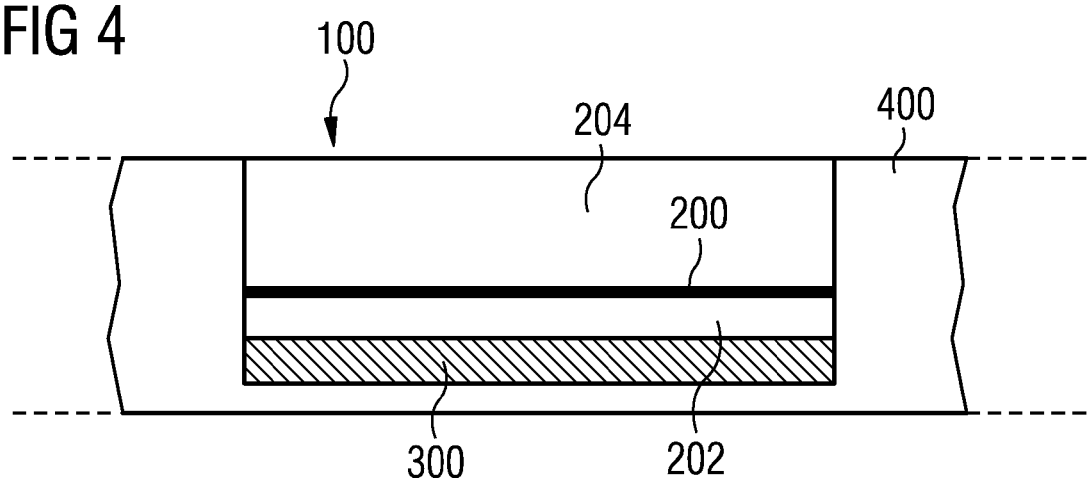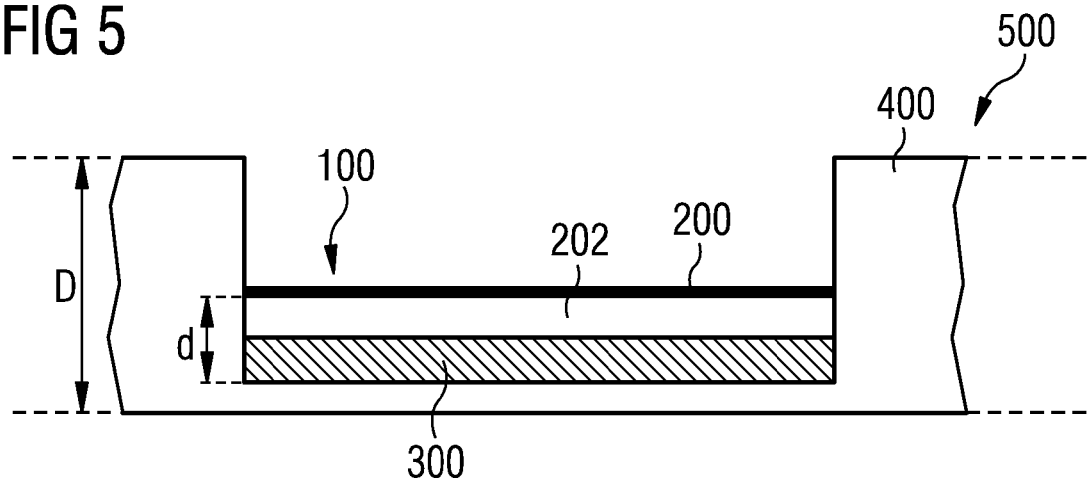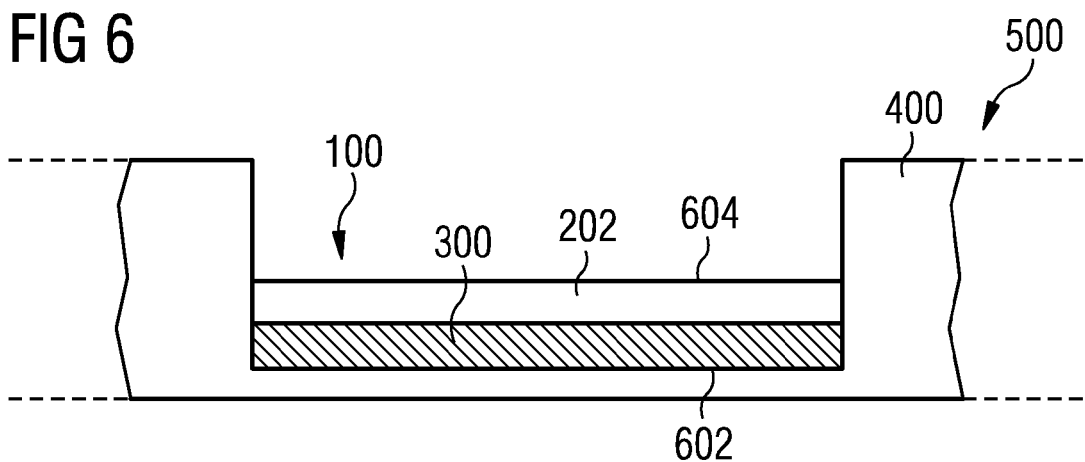

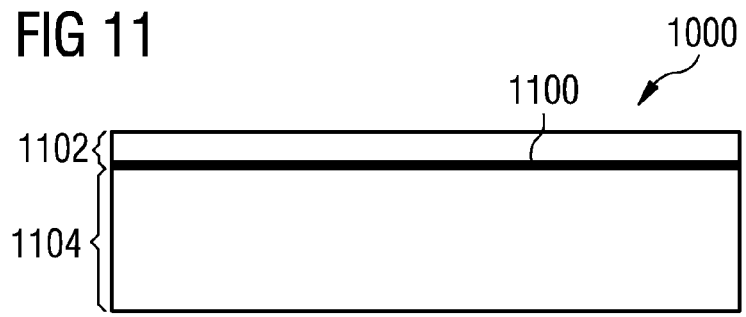
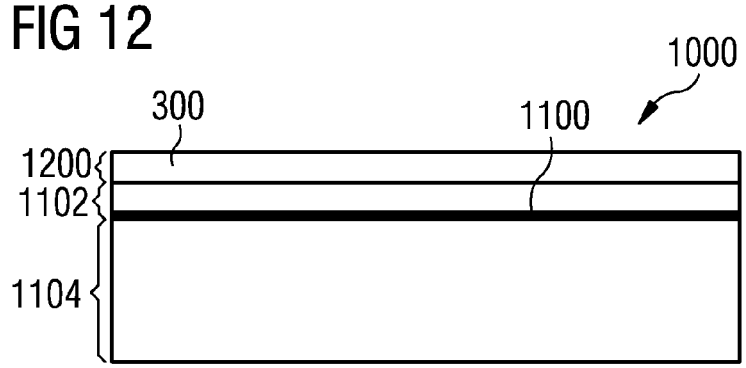
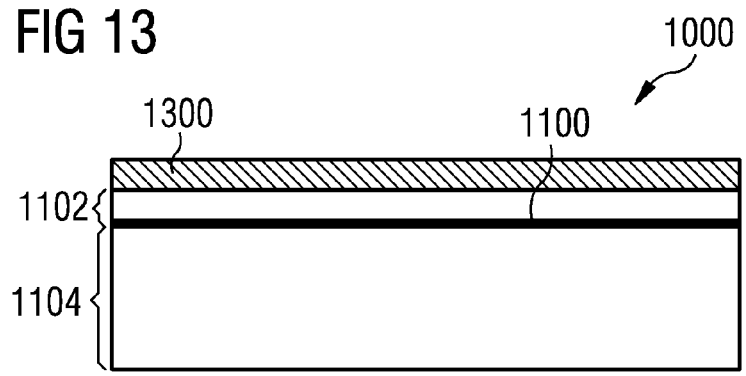

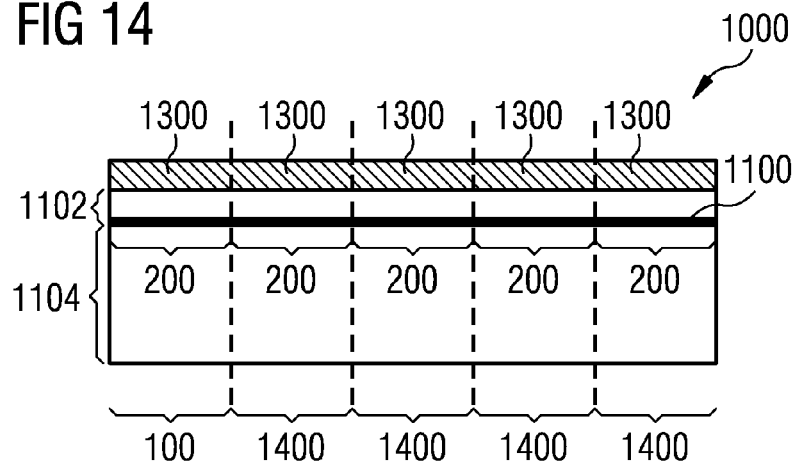
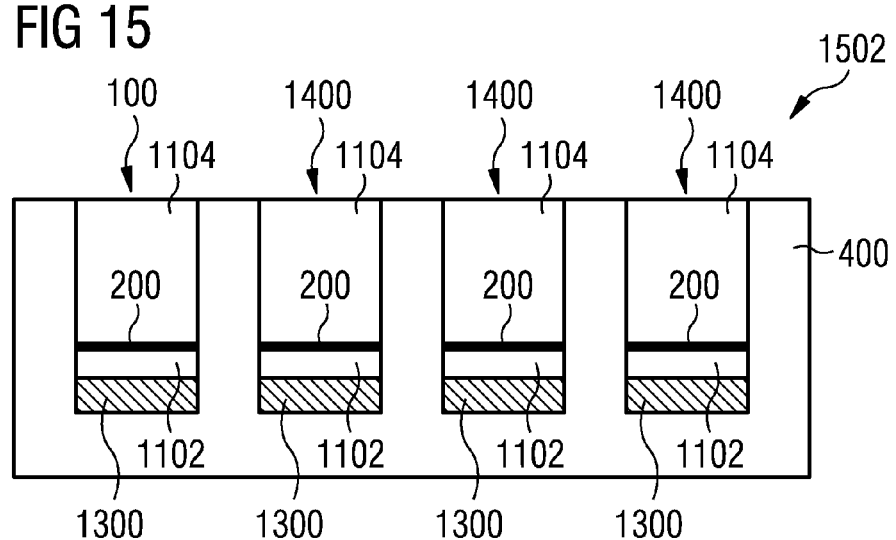
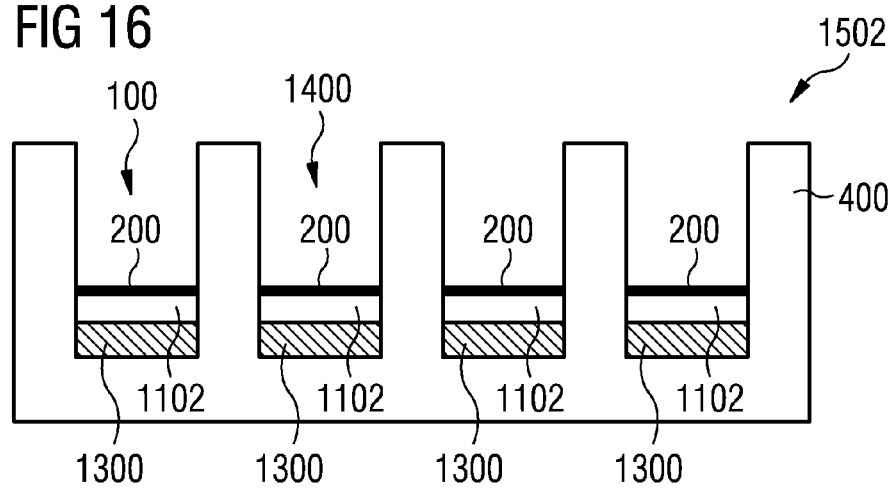

THINNING IN PACKAGE USING SEPARATION STRUCTURE AS STOP

BACKGROUND

Field

The present invention relates to a method of forming a thinned encapsulated chip structure, a method of forming a thinned encapsulated semiconductor device, a method of forming thinned encapsulated electronic chips, and an encapsulated chip structure.

Description of the Related Art

In many technological fields, electronic chips encapsulated within an encapsulating structure are used. There is a continuing trend to provide the electronic chips with a very small thickness, for instance for power applications. However, accurately thinning wafers electronic chips and handling them for encapsulating and subsequent processing is a challenge.

SUMMARY

There may be a need to perform thinning of electronic chips or wafers with high accuracy and without the risk of quality deteriorations during handling of thinned electronic chips or wafers.

According to an exemplary embodiment, a method of forming a thinned encapsulated chip structure is provided, wherein the method comprises providing a separation structure arranged within an electronic chip, encapsulating part of the electronic chip by an encapsulating structure, and thinning selectively the electronic chip partially encapsulated by the encapsulating structure so that the encapsulating structure remains with a larger thickness than the thinned electronic chip, wherein the separation structure functions as a thinning stop.

According to another exemplary embodiment, a method of forming a thinned encapsulated semiconductor device is provided, wherein the method comprises forming, on wafer level, a separation layer within a semiconductor chip forming part of a wafer so that the separation layer separates a first chip body of the semiconductor chip on one side of the separation layer with regard to a second chip body of the semiconductor chip on the other side of the separation layer, forming, on wafer level, at least one integrated circuit element in and/or on the first chip body, singularising the chip from the wafer, encapsulating part of the singularised chip by an encapsulating structure, removing selectively the second chip body up to the separation layer so that the encapsulating structure remains with a larger thickness than the first chip body.

According to yet another exemplary embodiment, an encapsulated chip structure is provided, which comprises a chip structure, at least one integrated circuit element in and/or on the chip structure, a separation structure forming part of the chip structure, and an encapsulating structure encapsulating the chip structure, wherein the chip structure comprises a material being selectively etchable relative to a material of the separation structure and a material of the encapsulating structure.

According to still another exemplary embodiment, a method of forming thinned encapsulated electronic chips is provided, wherein the method comprises providing a wafer with a separation structure which separates a first wafer body on one side of the separation structure with regard to a second wafer body on the other side of the separation structure, forming integrated circuit elements in and/or on the first wafer body, encapsulating part of the wafer in an encapsulating structure so that the second wafer body is exposed to an environment, and removing selectively the second wafer body up to the separation structure without substantially removing the encapsulating structure, and after the removing, singularising the wafer into the plurality of thinned encapsulated electronic chips each comprising a section of the first wafer body and a section of the encapsulating structure.

An exemplary embodiment has the advantage that an electronic chip or wafer is thinned in package (i.e. after at least partially encapsulating the electronic chip or wafer by an encapsulation structure) using a separation structure as an embedded thinning stop. By encapsulating the electronic chip or wafer within an encapsulating structure before carrying out the thinning procedure, handling of the thinned electronic chip is significantly simplified, since the encapsulating structure serves as a rigid and stable mechanical base supporting the electronic chip or wafer in the thinned configuration. Therefore, handling of an electronic chip can be performed by a permanent encapsulating structure (forming part of the final product) rather than by the use of a temporary carrier (not forming part of the final product). Hence, without the need of additional provisions, damage of the thinned electronic chip or wafer resulting from the handling of thinned structures may be safely prevented. Simultaneously, the thinning may be performed with a very high precision and uniformity, since the buried or embedded separation structure serves as a reliable and predictable thinning stop, so that the thinning procedure may be precisely stopped at a well-defined position.

According to an embodiment, it is of particular advantage that both formation of the separation structure and formation of integrated circuit elements within electronic chips may be performed on wafer level, i.e. before singularising a wafer into the electronic chips (being wafer sections). The thinning procedure may be performed after encapsulating and before or after singularising the electronic chips. Thus, formation of a separation structure with a high uniformity among different electronic chips and formation of integrated circuit elements may both be performed for many electronic chips simultaneously, and their thinning may be performed already in package. The encapsulating structure may be used as thinning mask which is not removed by thinning, thereby preventing safely the necessity to handle thinned electronic chips.

DESCRIPTION OF FURTHER EXEMPLARY EMBODIMENTS

In the following, further exemplary embodiments of the methods, and the encapsulated chip structure will be explained.

In the context of the present application, the term "encapsulated chip structure" may particularly denote a structure having one or more electronic chips (such as a semiconductor chip being singularised from a wafer or still forming part of a wafer) which is mounted within an encapsulating structure (such as a mold structure) as package. Such an electronic chip may have a thickness smaller than a thickness of a standard wafer and/or smaller than a thickness of the encapsulating structure.

In the context of the present application, the term "separation structure" may particularly denote a structure embedded in an interior of an electronic chip which locally has different chemical and/or physical properties, in particular in terms of its etchability (i.e. its capability of being etched), as compared to neighboring material. In particular, the material of the separation structure may be configured to be removable by etching with a lower etching rate than neighboring material, in particular with a significantly lower etching rate. In view of its specific chemical and/or physical properties, such a separation structure may spatially separate chip material (such as a chip body) on one side of the separation structure from chip material (such as another chip body) on the opposing other side of the separation structure. Thereby, the separation structure may have the capability to serve as an etch stop. In case the separation structure is configured as a thin planar layer, it may also be denoted as a separation layer. The separation structure of an electronic chip may form part of a larger separation master structure of a wafer comprising multiple sections each having an electronic chip with assigned embedded separation structure. In particular, such a separation master structure may be configured as a separation master layer, i.e. a thin planar layer embedded within and extending over the entire wafer.

In the context of the present application, the term "thinning selectively the electronic chip" may particularly denote that a thinning procedure (such as a back etching procedure or a mechanical grinding procedure) can be applied which removes the material of the electronic chip with a significantly higher removal rate (such as a grinding rate or an etching rate) than the encapsulating structure and/or the separation structure.

In the context of the present application, the term "thinning stop" may particularly denote that the thinning is automatically stopped at the separation structure since the thinning procedure, when reaching the separation structure, will face a barrier for continuing with the efficient material removal of the thinning procedure. This may be achieved by a non-etchable property of the separation structure and/or by a beginning of the removal of the separation structure which can be detected in an environment of the thinned encapsulated chip structure to be manufactured (for instance by an analysis of the exhaust gas of a plasma etching device, wherein a sudden change of the composition of the exhaust gas is indicative of the fact that the back etching procedure has now reached the separation structure).

In the context of the present application, the term "on wafer level" may particularly denote that a certain procedure is not carried out for an individual chip only or for a number of individual electronic chips (which may or may not be connected to one another by a separate matrix or the like), but in contrast to this is applied to a plurality of electronic chips (such as semiconductor chips) forming part of an integral wafer (such as a semiconductor wafer). For instance, such a wafer may be a semiconductor wafer and a corresponding electronic chip may be a part of this wafer which may be later singularised to form the electronic chips as structures being separate from one another.

In the context of the present application, "arranged within" may be particularly understood as "located in" or "buried in".

A gist of an exemplary embodiment can be seen in that thinning of semiconductor substrates (for instance silicon wafers, silicon chips) down to a well-defined final thickness is made possible with high uniformity and without involving thin wafer handling or thin chip handling. In particular, thinning in package may be highly advantageously achieved by applying separation by implantation of oxygen (SIMOX). A corresponding ion implantation of oxygen into a standard wafer substrate followed by an anneal process results in the formation of a buried silicon oxide layer. The thin single crystal silicon substrate layer above the silicon oxide may then serve as a substrate for a semiconductor manufacturing process (front end of the line (FEOL), back end of the line (BEOL)). The systems (substrates, chips) may be embedded upside down in an encapsulating structure such as a mold compound (for instance for forming a mold wafer) and may then be thinned with a plasma etching process (for instance utilizing the mold structure as etching mask). This etch advantageously stops upon exposure of the buried silicon oxide layer. Thus, the termination of the etching procedure can be spatially defined with high accuracy. If desired, the exposed silicon oxide layer can, in turn, be readily removed by a further highly selective etch process. During this thinning in package (or thinning in encapsulation) process, the encapsulation structure may simultaneously form both the package itself and the etching mask for the thinning in package process. Using the buried implanted silicon oxide layer as thinning stop has two significant advantages. On the one hand, a cheap standard semiconductor substrate may be used as a basis (which is less expensive than a silicon on insulator substrate, SOI). Secondly, the implantation of ions into a crystalline semiconductor wafer forms the separation structure at a small depth within the wafer, for instance at a depth in the order of magnitude of micrometers. Therefore, integrated circuit elements (such as transistors, in particular components with a vertical current flow) may be formed within this very small crystalline surface region (if desired additionally thickened by an epitaxial growth on this still substantially crystalline surface layer). Such a small thickness results in proper electric properties of the integrated circuit elements. Moreover, the thickness of the final chip can be made extremely small due to back etching of the large majority of substrate material on the side of the separation structure opposing the thin surface layer with the integrated circuit elements. Thus, extremely thin electronic chips may be manufactured, which is of particular advantage for power semiconductor chips. Since the encapsulation structure remains substantially non-thinned during thinning the electronic chip and therefore remains as a mechanically robust support, isolated handling of thinned electronic chips or wafers may be safely prevented.

In an embodiment, the encapsulating structure may be a molding structure. In the context of the present application, the term "molding structure" may particularly denote a mold which can be supplied in a liquid or granulate form by depositing it over the electronic chips and which can be subsequently hardened or cured so that at least a part of the electronic chip surface is covered by the mold material. The mold material may be a plastic material, having, if desired or required, filler particles embedded therein for adjusting the material properties thereof (for instance for increasing the thermal conductivity).

In an embodiment, the method further comprises forming a separation master structure arranged within a wafer, and singularising the wafer with its separation master structure into the electronic chip with its separation structure being formed by a portion of the separation master structure, and into at least one further electronic chip each having a separation structure being formed by another portion of the separation master structure. Such a separation master structure may be a continuous buried separation layer formed at a constant depth within the wafer so that the separation structure for each individual electronic chip to be singularised from this wafer can be manufactured in one batch procedure for all these electronic chips on wafer level. This is not only an efficient and fast processing architecture, but also allows to ensure a high degree of conformity and homogeneity among the individual chips.

In an embodiment, the method further comprises, before the singularising, forming integrated circuit elements in a portion of the wafer being separated by the separation master structure from another portion of the wafer so that, after the singularising, each of the electronic chip and the at least one further electronic chip comprises at least one of the integrated circuit elements. Therefore, also the integration of the integrated circuit elements (such as transistors, in particular field effect transistors and/or bipolar transistors, diodes, sensors, actuators, microelectromechanical systems (MEMS), membranes, etc.) can also be performed on wafer level and therefore fast and with high homogeneity. In an embodiment, the method comprises forming at least one integrated circuit element in a portion of the electronic chip being separated by the separation structure from another portion of the electronic chip being removed by the thinning. Therefore, one side of the electronic chip material relative to the separation structure may be used for integration of integrated circuit components, whereas the opposing other side may be used for temporarily supporting the electronic chip when being overmolded.

In an embodiment, the method further comprises, before the singularising and before the forming of the integrated circuit elements, epitaxially growing an additional body to form part of the portion of the wafer being separated by the separation master structure from the other portion of the wafer, wherein the integrated circuit elements are formed at least partially in the additional body. In case the thickness of the chip body on one side of the separation structure (for instance the significantly thinner chip body formed close to a surface of the wafer as a result of the formation of the separation master structure by implantation) should not be sufficient to properly implement integrated circuit elements according to a given layout, it is possible to epitaxially grow additional material on the thin chip body. It is presently believed that the implantation of the ions within the chip body substantially maintains the crystallinity of the thin chip body undisturbed, so that an epitaxial growth with sufficient quality is possible. Therefore, the thickness of the semiconductor chip body used for integration of integrated circuit components may be increased, if desired, up to a user-definable thickness.

In an embodiment, the separation structure is formed by implanting particles within the electronic chip. In particular, the separation structure is formed by implanting particles into a portion of a wafer forming the electronic chip after singularising the wafer into the electronic chip and at least one further electronic chip so that the implanting may be performed on wafer level. Such particles may be oxygen particles (or alternatively nitrogen particles, etc.) which are implanted into the substrate (wafer, electronic chip) and will form the separation structure at a depth within the substrate which can be adjusted by the implantation energy of the ions. Such a procedure not only results in a cheap formation of the separation structure, but also allows to obtain a very thin layer above the separation structure remaining after the thinning procedure. A short path of a current propagating through one or more integrated circuit elements provided over the small thickness may advantageously result in small ohmic losses.

In an embodiment, the separation structure is thermally annealed after the implanting and before the thinning. Thermally annealing may include heating the substrate with the implanted ions therein to thereby allow structural recovery of the substrate material and completion of the formation of the separation structure.

In an alternative embodiment, the separation structure is provided as a silicon oxide layer between two silicon bodies of a silicon-on-insulator (SOI) substrate. Thus, also an SOI wafer may be used as a basis for the formation of thin encapsulated electronic chips which do not have to be handled without a permanent support. Such SOI wafers may have the advantage that, if a specific application requires a relatively thick body for implementing integrated circuit elements, this can be provided by an SOI substrate.

In an embodiment, the electronic chip is laterally surrounded by the encapsulating structure while two opposing main surfaces (i.e. a top surface and a bottom surface) of the electronic chip remain exposed to an environment. Such an embodiment (compare for instance FIG. 9) allows to subsequently access both opposing surfaces of the thinned electronic chip for the formation of a peripheral connection (such as electric contacts, etc.).

In an alternative embodiment, the electronic chip is laterally surrounded by the encapsulating structure and one of two opposing main surfaces (in particular a bottom surface) of the electronic chip is covered at least partially by the encapsulating structure, while the other one of the two opposing main surfaces (in particular a top surface) remains exposed to an environment. Such an embodiment (compare for instance FIG. 6) has the advantage that the thinned electronic chip being mechanically sensitive is safely supported by the encapsulating structure also from a bottom side. An access to this bottom side is possible by a formation of one or more through holes in the encapsulating structure, for instance for electrically connecting the bottom of the thinned electronic chip to an environment, etc. The top surface may be directly accessed for providing an electric connection.

In an embodiment, the method comprises selectively removing the separation structure after the thinning. In certain embodiments, removal of the separation structure after the thinning may be desired, for instance to get direct access to a surface of the chip body directly next to the separation structure. In such a scenario, it is possible to apply an additional second selective etching procedure which removes selectively material of the separation structure while being incapable of removing material of the encapsulating structure and the rest of the thinned electronic chip.

In an embodiment, the thinning is performed by back etching material of the electronic chip while the encapsulating structure serves as an etch mask. The encapsulation structure thereby remains as a robust mechanical support even after the thinning of the electronic chip in package. Such a concept allows to omit temporary carriers, since no handling of electronic chips needs to be done without the mechanically supporting encapsulating structure.

In an embodiment, the back etching process is a plasma etching process. Plasma etching allows for a highly selective removal of semiconductor material of the electronic chip, while preventing removal of semiconductor oxide material of the separation structure.

In an embodiment, the method further comprises forming a further separation structure arranged within a further electronic chip, encapsulating part of the further electronic chip by the encapsulating structure together with the electronic chip, and thinning selectively the further electronic chip partially encapsulated by the encapsulating structure together with the electronic chip so that the encapsulating structure remains with a larger thickness than the thinned further electronic chip. During this process, the further separation structure functions as a thinning stop concerning the thinning of the further electronic chip. Therefore, it is possible to form an artificial wafer of several non-thinned electronic chips having separation structures buried therein, wherein the artificial wafer connects these multiple electronic chips by a common encapsulating structure. Then, thinning up to the individual separation structures serving as a common thinning stop may be performed on artificial wafer basis before singularising the artificial wafer into individual sections each comprising a thinned electronic chip in a package formed by part of the common encapsulating structure. This is a very efficient procedure in terms of processing time and costs.

In an embodiment, the separation structure and the further separation structure are formed at the same height level. Thus, a high uniformity of the thinning between many electronic chips at the same time may be guaranteed.

In an embodiment, the method comprises singularising sections each comprising a respective one of the thinned electronic chips encapsulated by a respective portion of the encapsulating structure. Therefore, after having thinned many electronic chips in package, they may be separated to form separate encapsulated electronic chip components in a batch process.

In an embodiment, the electronic chip is a semiconductor chip, in particular a semiconductor power chip. For example, such a semiconductor power chip may be used for automotive applications. A semiconductor power chip may comprise one or more field effect transistors, diodes, inverter circuits, half-bridges, etc.

In an embodiment, the first chip body (i.e. a portion of the electronic chip between one of its main surfaces and the separation structure) is formed with a thickness of less than about 10 µm, in particular of less than about 1 µm. Such small thicknesses may be produced by ion implantation, wherein the adjustment of the ion energy has a predictable impact on the thickness. Since such power semiconductor devices may function based on a vertical current flow through the thinned electronic chip, particularly the combination with a SIMOX implantation process is highly advantageous, because This allows to obtain extremely thinned active regions of electronic chips, therefore having a low resistance during use.

In an embodiment, the method comprises forming an additional body on the first chip body on wafer level. The additional body may be epitaxially grown on the first chip body. After implantation, an epitaxial growth on the small thin surface portion being defined by the separation structure is possible. This allows to adjust the thickness of the region in which integrated circuit elements can be integrated up to a defined value, so that there remains no limitation in terms of thickness in view of a maximum achievable depth in which the separation structure can be formed by ion implantation.

In an embodiment, the chip structure comprises silicon and the separation structure comprises silicon oxide. Silicon oxide and silicon is a particularly appropriate material choice, since silicon oxide can be highly selectively etched by plasma etching against silicon oxide.

In an embodiment of the encapsulated chip structure, the separation structure is arranged on a surface of the chip structure (such as an electronic chip or a wafer) in such a way that a gap (or a step) is formed between the separation structure and the adjacent encapsulating structure. Such a gap or step can be formed by a selective etching process for back etching the electronic chip.

In an embodiment, the chip structure has a first part and a second part, the first part comprising an epitaxially grown additional body which is epitaxially grown on the second part and comprising the at least one integrated circuit element, and the second part being located between the separation structure and the first part. Together, the first part and the second part may form the above-mentioned first chip body. The thickness of the first part is defined by the conditions (in particular the duration) of the epitaxial growth procedure. The thickness of the second part is defined by the implantation energy of the ions.

In an embodiment, the device comprises a further separation structure on a surface of a further chip structure (such as a further electronic chip), wherein part of the further chip structure is encapsulated by the encapsulating structure together with the chip structure. Therefore, many electronic chips may be encapsulated by a common molding structure at the same time.

In one embodiment, the electronic chips may be used as sensors or actuators in microelectromechanical systems (MEMS), for example as pressure sensors or acceleration sensors. In another embodiment, the electronic chips may be used as semiconductor chips for power applications for instance in the automotive field and may for instance have at least one integrated insulated-gate bipolar transistor (IGBT) and/or at least one integrated diode.

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology. However, it is also possible to use, as substrate or wafer, a solid body (for instance of crystalline silicon) on which a sponge like structure (for instance a sponge like layer of silicon) is arranged. It may then be possible to implant particles for forming the separation structure through or via the sponge like structure. It may even be possible to later use the sponge like structure (having some remaining degree of crystallinity) as a basis for an epitaxial growth of a crystalline additional body (for instance a crystalline silicon body) thereon.

For the encapsulating, encapsulating or encapsulation, a plastic material or a ceramic material may be used. Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of exemplary embodiments will become apparent from the following description and the appended claims, taken in conjunction with the accompanying drawings, in which like parts or elements are denoted by like reference numbers.

BRIEF DESCRIPTION OF THE DRAWINGS

The accompanying drawings are included to provide a further understanding of exemplary embodiments and constitute a part of the specification.

In the drawings:

FIG. 1 to FIG. 6 show different cross-sectional views of structures obtained during carrying out a method of forming thinned encapsulated chip structures according to an exemplary embodiment.

FIG. 10 to FIG. 17 show different structures obtained during carrying out a method of forming thinned encapsulated semiconductor devices according to yet another exemplary embodiment.

DETAILED DESCRIPTION OF EXEMPLARY EMBODIMENTS

Figure 1:
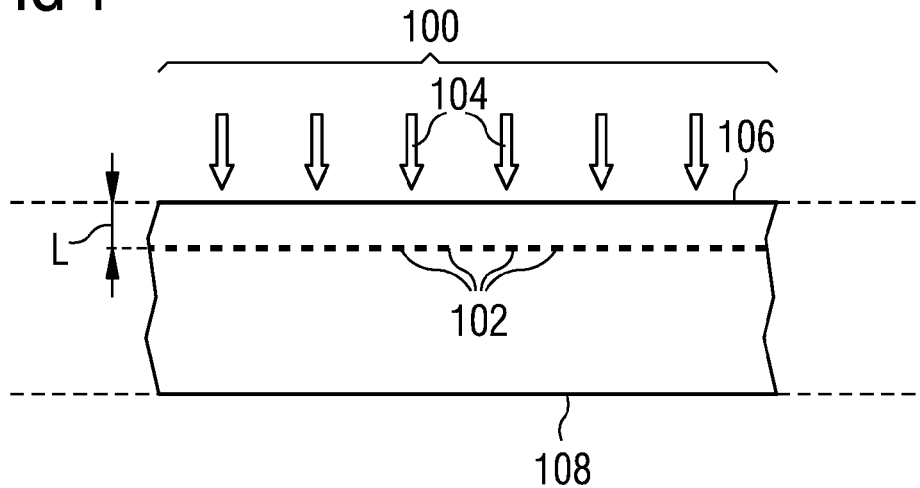

The illustration in the drawing is schematically and not to scale.

Before exemplary embodiments will be described in more detail referring to the figures, some general considerations will be summarized based on which exemplary embodiments have been developed.

One conventional approach for thinning electronic chips is mechanical grinding of a wafer to be thinned, wherein however the wafer has to be mounted on a carrier system using glues and/or foils for a mechanical stabilization during the grinding process. Another conventional approach is to use a mechanical wafer grinding of the wafer to be thinned with a process leaving the original substrate thickness at the edge of the wafer substrate and forming a ring at the edge of the thinned central wafer area for mechanical stabilization of the wafer. Another conventional approach is a plasma-based back etch of systems such as substrates or chips embedded in a mold component for mechanical stabilization (forming a so-called mold wafer) with timed plasma etch processes (based on known etch rates) or by detections of species by pre-processes at the desired final wafer thickness which may trigger the end of the process. However, the described conventional procedures exhibit only limited thinning accuracy due to the inherent non-uniformities of the processes involved.

Thus, thinning of semiconductor systems (for instance silicon wafer substrates, silicon chips) down to a well-defined final thickness with high uniformity (i.e. without involving thin wafer handling or chip handling) is still a challenge. Thinned electronic chips or wafers, having a tendency to bend, involve significant technological problems in terms of handling them during a manufacturing procedure as well as during singularisation of a thinned wafer. The conventional use of temporary carrier systems may help during such a handling of thinned electronic chips, but may still involve the risk of yield loss and also involves an additional effort.

Exemplary embodiments of thinning electronic chips on chip level or on wafer level in package and using a buried separation structure as a thinning stop may overcome such yield losses and provide an improved quality and reliability of the manufactured encapsulated thinned electronic chips. The use of temporary carriers is dispensable according to such embodiments, since the encapsulating structure itself serves as a (however permanent, i.e. still included in the final product) carrier. The use of an implanted etch stop is highly advantageous, since it allows the formation of a very thin electronic chip or wafer at low cost and ensures a high accuracy of the resulting thickness, since thinning using the separation structure as thinning stop is significantly more precise than thinning by time.

FIG. 1 illustrates an electronic chip 100 forming part of a wafer, as indicated schematically by dotted lines in FIG. 1. The wafer based on which the shown process is carried out is a crystalline silicon wafer. A front side of the wafer is indicated by reference numeral 106, whereas a back side thereof is indicated with reference numeral 108. In order to obtain the structure shown in FIG. 1, ion implantation by oxygen is performed, i.e. high energetic oxygen particles 102 are implanted into the wafer to form a buried layer within the silicon wafer. The implanting procedure is indicated schematically with reference numeral 104. Consequently, an oxygen-rich region is formed at a depth, L, within the wafer, wherein L may be several micrometers. By adjusting the energy of the oxygen particles 102, the depth L can be adjusted. By the implantation procedure, the crystallinity of the wafer is not substantially deteriorated, even the thin surface layer of thickness L still shows a high degree of crystallinity.

Figure 2:
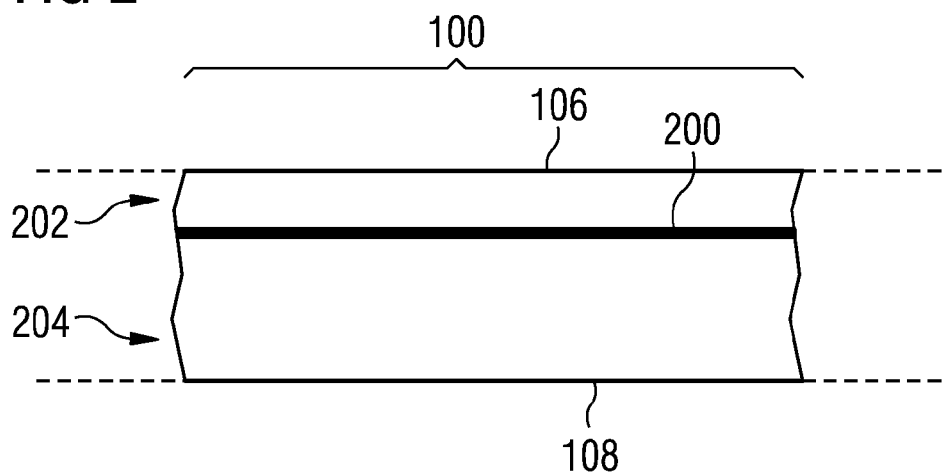

In order to obtain the structure shown in FIG. 2, the structure shown in FIG. 1 is made subject to an annealing procedure by heating the structure of FIG. 1 to an elevated temperature. By this procedure, a separation structure 200, here formed as a continuous layer, is formed buried within the wafer and therefore buried within the electronic chip 100. By the formation of the separation structure 200, a separation between a first body 202 (delimited by the front side 106 and the separation structure 200) and a second body 204 (delimited by the back side 108 and the separation structure 200) of the electronic chip 100 and the entire wafer takes place.

Referring to FIG. 1 and FIG. 2, it has been described how a continuous uninterrupted layer is formed as separation structure 200. Alternatively, it is also possible in each embodiment to form a separation structure 200 as a discontinuous interrupted structure within a wafer. Additionally or alternatively, it is also possible to form a separation structure 200 only along a section of an electronic chip 100, whereas another section of the electronic chip 100 remains free of the separation structure 200. In such an embodiment, the thinning will only stop in the former section of the electronic chip 100, whereas the latter section of the electronic chip 100 will not stop since the separation structure 200 is locally lacking there. Taking this measure may be advantageous since it may allow the formation of one or more vias in the latter section or a local reduction of the substrate thickness to expose a dicing grid. In order to keep a section of an electronic chip 100 or a wafer free of the separation structure 200 and a corresponding measure may be taken, for instance a mask may be locally applied or a screen may be used.

Figure 3:
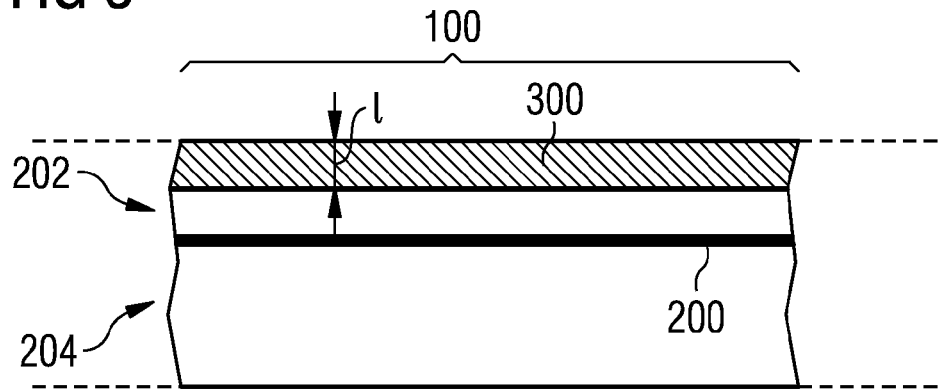

In order to obtain the structure shown in FIG. 3, an additional body 300, here formed as an epitaxially grown layer, is epitaxially grown on the front side 106 still on wafer level. The thickness, l, of the additional body 300 can be adjusted by properly setting the epitaxial growing time, and can be for instance in a range between 3 μm and 60 μm, depending on the application and the integrated circuit elements to be formed in the following, i.e. depending on the device to be formed. During the epitaxial growth procedure, it is advantageously possible to make use of the remaining crystallinity of the first body 202 which is believed to be not significantly disturbed by the implantation procedure described above.

Alternatively, it is also possible to omit the epitaxial growing procedure in a scenario in which the thickness L of the first body 202 is sufficient for forming the integrated circuit elements for a specific device design.

Advantageously, the thickness L of the first body 202 is very small due to the implantation process, so that the formed devices are particularly suitable for power applications in which a vertical current flow occurs and therefore the resistance can be advantageously kept small if the thickness L or L+l is sufficiently small.

Although not shown, it is possible to form integrated circuit elements in the additional body 300 and/or the first body 202 starting from the structure shown in FIG. 2 or the structure shown in FIG. 3. This can still be performed on wafer level or alternatively already on chip level, i.e. after a singularisation of the wafer into the individual chips 100.

In order to obtain the structure shown in FIG. 4, the wafer shown in FIG. 3 is singularised (for instance by sawing, etching or a laser treatment), and the individual chip 100 can be embedded in an encapsulating structure 400. This can be performed either individually for each of the electronic devices 100, or for multiple electronic devices 100 together by embedding them in a common encapsulating structure 400. For the encapsulating procedure, the electronic chip 100 shown in FIG. 4 is turned around by 180°, i.e. is arranged upside down, compared to the arrangement of FIG. 3. Although not shown in FIG. 4, it is possible to form bore holes in a bottom portion of the encapsulating structure 402 to be able to electrically access the additional body 300 with the integrated circuit elements formed thereon and/or therein. For instance, a printed circuit board connection can be formed by such bore holes.

In order to obtain the structure shown in FIG. 5, the structure shown in FIG. 4 is made subject to a selective back etching procedure by which selectively the material of the second body 204 (of crystalline silicon material) is removed completely by a selective etching procedure. During this etching procedure, the encapsulating structure 400 serves as an etch mask and is hence substantially prevented from being removed.

As can be taken from FIG. 5, the separation structure 200 serves as an etch stop or thinning stop during the plasma back etching process. Thus, the etching procedure stops upon reaching the buried oxide material. This allows for a very efficient thinning of the electronic chip 100, because the thickness of the second body 204 is significantly larger than the thickness of the first body 202. The thickness of the second body 204 may be several hundred micrometers or more. Since the separation structure 200 provides a well-defined thinning stop, the accuracy of the thickness remaining after the back etching is very high.

Optionally, the thinned electronic chip 100 embedded upside down in the encapsulating structure 400 can then be further treated in a way as shown in FIG. 6 to selectively remove the separation structure 200. This is performed by a further back etch for removing the silicon oxide material of the separation structure 200 while preventing the encapsulating structure 400 (again functioning as an etching mask) and the material of the first body 202 (here serving as an etch stop) from being removed.

By the described process flow, thinned encapsulated chip structure 500 shown in FIG. 5 or FIG. 6 is produced, having the thinned electronic chip 100 embedded within the non-thinned encapsulating structure 400 also serving as a permanent carrier for mechanically supporting the thinned electronic chip 100. Handling of the thinned electronic chip 100 alone (i.e. apart from the package) is therefore not necessary. Furthermore, also the use of temporary carriers is dispensable during manufacturing (and also during a possible post-processing). As can be taken from FIG. 5 and FIG. 6, the thinned encapsulated chip structure 500 also provides a mechanic bottom protection of the thinned electronic chip 100, since the encapsulating structure 400 packages the thinned electronic chip 100 in a cup-like manner not only laterally but also from a bottom side.

After manufacture of the thinned encapsulated chip structure 500, it is possible to post-process the latter, for instance by forming electric contacts (such as vias, doped regions, contact pads) on and/or in the exposed first body 202 of crystalline silicon material. It is also possible to form through-holes in the bottom portion of the cup-shaped mold structure 400 so as to contact the additional body 300 from a bottom side. Such a formation of through-holes may for instance be performed by a laser. Also mounting the thinned encapsulated chip structure 500 on a mounting base (for instance a printed circuit board) is possible. Hence, manufacture of the thinned encapsulated chip structure 500 may be completed using wafer level processes and/or chip level processes.

Figure 7:
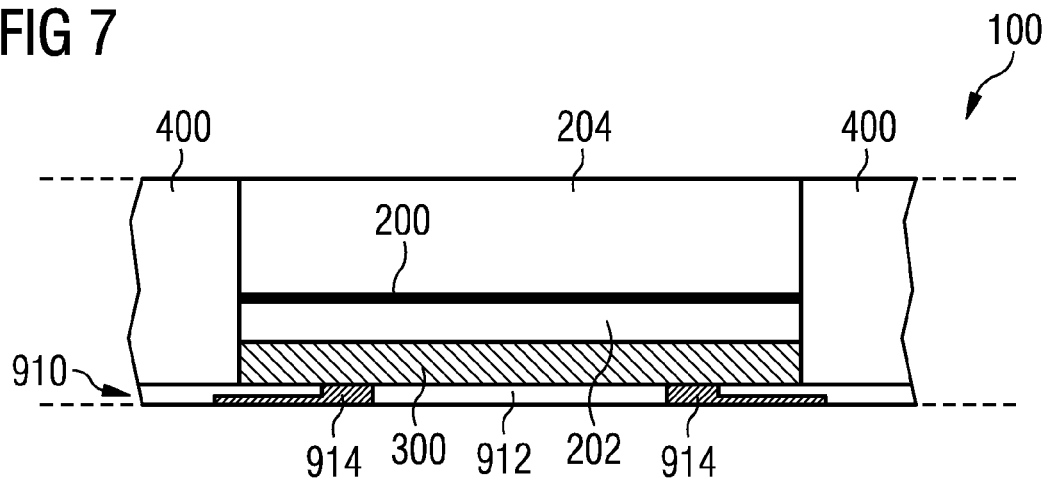
FIG. 7 to FIG. 9 show different structures obtained during carrying out a method of forming thinned encapsulated chip structures according to another exemplary embodiment.
Figure 8:
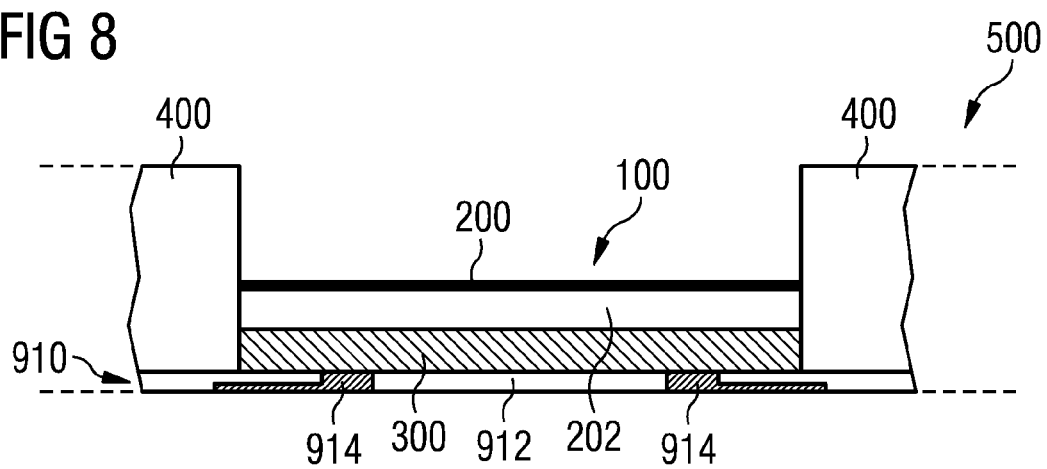
Figure 9:
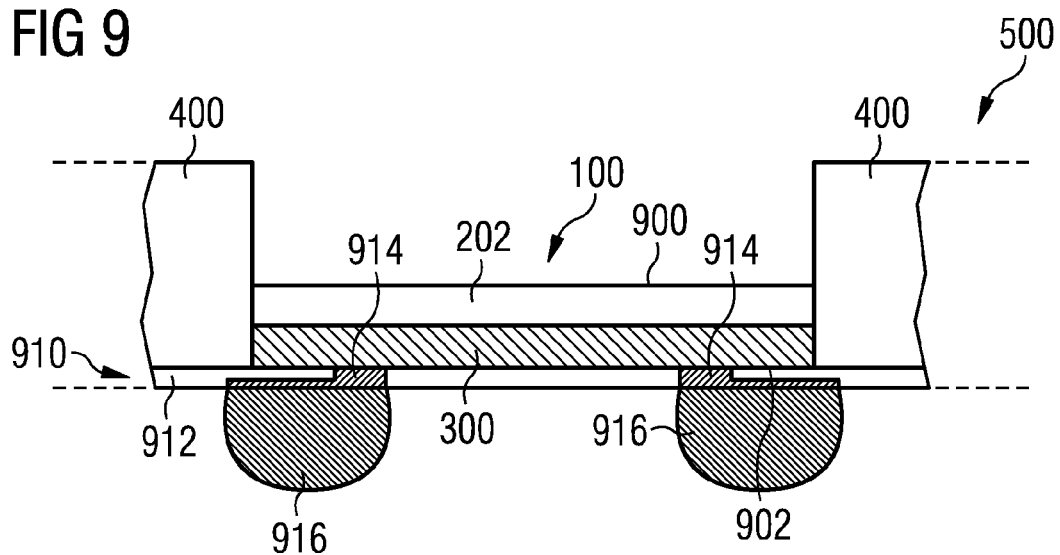

FIG. 7 to FIG. 9 show structures obtained during carrying out a method of forming a thinned encapsulated chip structure 500 (compare FIG. 8 and FIG. 9) according to another exemplary embodiment, starting from the singularised electronic chip 100 obtained after carrying out the procedures described above referring to FIG. 3.

As can be taken from FIG. 7, the formation of the encapsulating structure 400 differs from FIG. 3 to FIG. 6 in that the encapsulating structure 400 only laterally surrounds the electronic chip 100 without closing the bottom of the electronic chip 100. Before continuing with the processing according to FIG. 8, it is possible to form a re-distribution layer 910 (for instance constituted by one or more dielectric layers 912 with integrated electrically conductive connection portions 914 therein.

In order to obtain the thinned encapsulated chip structure 500 shown in FIG. 8, the second body 204 is removed by back etching, wherein the separation structure 200 of silicon oxide material again serves as a thinning stop. The thinned encapsulated chip structure 500 may be used as shown in FIG. 8 or may be further processed by removing the separation structure 200 by a further selective etching procedure, which does not influence the encapsulating structure 400 and the crystalline silicon material of the first body 202, see FIG. 9.

After having finished this procedure, it is possible to connect the re-distribution layer 910 at its integrated electrically conductive connection portions 914 to solder balls 916 or the like at a bottom surface. If required or desired, it is also possible to form electrically conductive contacts (not shown) on a top surface 900 of the thinned electronic chip 100 shown in FIG. 9. The re-distribution layer 910 is formed on a bottom surface of the thinned electronic chip 100. It should however be said that other electric contact structures are possible as well.

In the following, referring to FIG. 10 to FIG. 17, a method of forming a plurality of thinned encapsulated semiconductor devices or encapsulated chip structures 500 according to an exemplary embodiment will be explained.

FIG. 10 shows as a standard crystalline silicon wafer 1000 used as a substrate for starting the process.

In order to obtain the structure shown in FIG. 11, oxygen particles (or nitrogen particles) are implanted into the wafer 1000 to thereby form a buried oxygen-rich region within the wafer 1000 which, after annealing, results in the formation of a separation master structure 1100. The separation master structure 1100 is formed on wafer level and divides the wafer 1000 into a first wafer body 1102 above the separation master structure 1100 and a second wafer body 1104 below the master separation structure 1100.

In order to obtain the structure shown in FIG. 12, an additional body 300, of crystalline silicon, is epitaxially grown on the first wafer body 1102 to obtain a thicker layer for the formation of integrated circuit components above the separation master structure 1100. Since the implantation procedure described referring to FIG. 11 does not disturb the crystallinity of the first wafer body 1102 significantly, such an epitaxial growth is possible.

In order to obtain the structure shown in FIG. 13, integrated circuit elements 1300 are formed in the additional body 300 by carrying out semiconductor processes. Such integrated circuit elements 1300 may comprise transistors such as field effect transistors or bipolar transistors, diodes, sensors, actuators, MEMS components, etc. It should be mentioned that, in the shown embodiment, the formation of the integrated circuit elements 1300 is still performed on wafer level.

As can be taken from FIG. 14, the processed wafer 1000 of FIG. 13 is then singularised into various electronic chips 100, 1400. Each of the electronic chips 100, 1400 comprises at least one of the integrated circuit elements 1300, a portion of the first wafer body 1102, a portion of the separation master structure 1100 (being denoted as separation structure 200 of the respective electronic chip 100, 1400) and a portion of the second wafer body 1104. The singularisation, shown schematically in FIG. 14 by dashed lines, can be performed by sawing, etching, etc.

The individual electronic chips 100, 1400 are then embedded upside down in a common encapsulating structure 400 by overmolding, as shown in FIG. 15, to thereby manufacture an artificial wafer 1502. The orientation of the electronic chips 100, 1400 has been turned by 180° as compared to FIG. 14.

In order to obtain the structure shown in FIG. 16, the artificial wafer 1502 is then made subject of a back etching procedure to thereby remove the second body 1104 from each of the chips 100, 1400 simultaneously, using the respective separation structures 200 as respective etch stops. During this etching procedure, only the crystalline silicon material is attacked, but not the silicon oxide material of the separation structures 200 and not the encapsulating structure 400.

Figure 17:
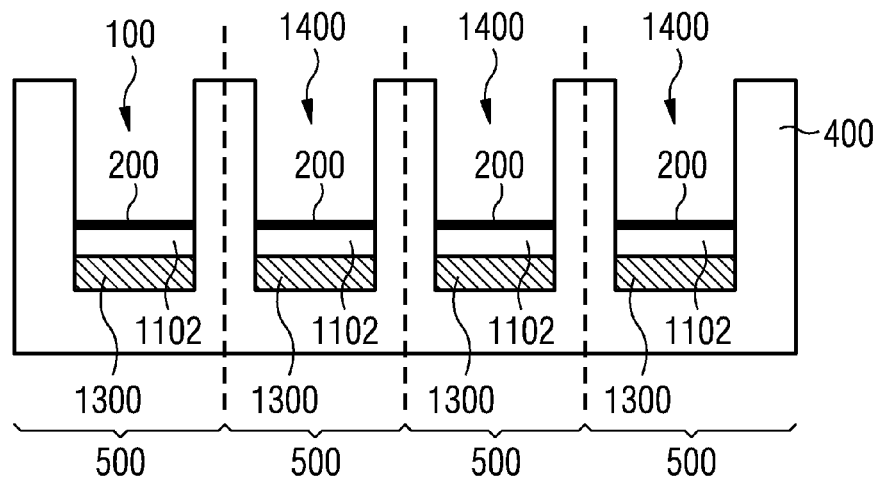

As can be taken from FIG. 17, the artificial wafer 1502 is then singularised into multiple individual thinned encapsulated electronic chips 500.

Thus, again referring to FIG. 10 to FIG. 17, formation of the separation master structure 1100 and of the integrated circuit elements 300 is performed on wafer level, i.e. using a pure semiconductor wafer 1000. After singularisation of this wafer 1000 into the individual electronic chips 100, 1400 and after embedding the individual electronic chips 100, 1400 upside down into a common encapsulation structure 400 to form an artificial wafer 1502, thinning of the electronic chips 100, 1400 is performed in package using the separation structures 200 constituted from the separation master structure 1100 as thinning stop. No handling of the sensitive thinned electronic chips 100, 1400 without the package is necessary. After the thinning, the artificial wafer 1502 may be singularised to thereby form the thinned encapsulated electronic chips 500. These can be contacted, if desired, from a top and/or bottom side, as described above.

Figure 18:
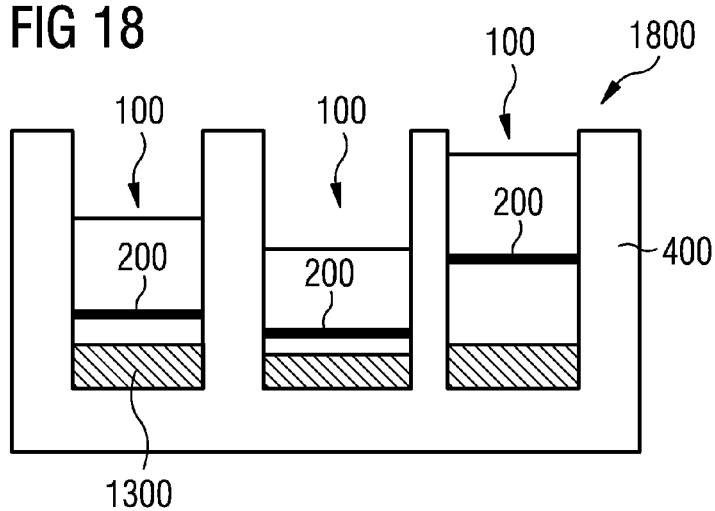
FIG. 18 illustrates a chip device according to an exemplary embodiment in which multiple electronic chips having separation structures at different height levels are encapsulated within one and the same encapsulating structure.

FIG. 18 illustrates a chip device 1800 manufactured according to an exemplary embodiment in which multiple electronic chips 100 having separation structures 200 at different height levels are encapsulated within one and the same encapsulating structure 400.

Figure 19:
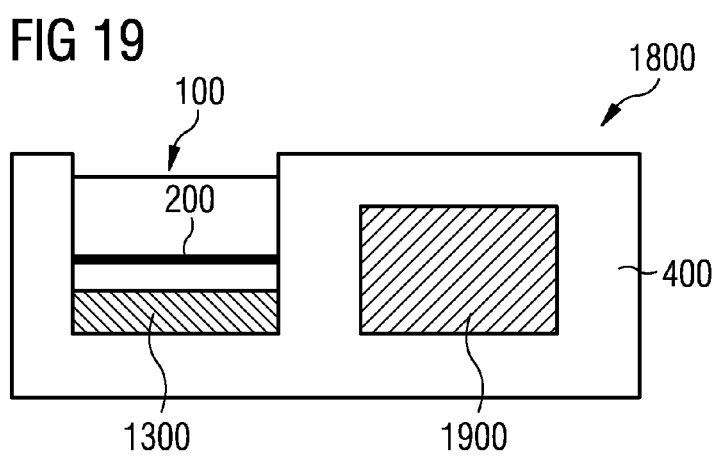
FIG. 19 illustrates a device having an electronic chip with a buried separation structure partially encapsulated in an encapsulating structure and further comprising a logic chip being fully encapsulated within the encapsulating structure.

FIG. 19 shows an electronic arrangement 1800 according to an exemplary embodiment in which an electronic chip 100, thinnable in the encapsulation structure 400, is embedded partially by the encapsulation structure 400 together with a further logic chip 1900 being fully encapsulated within the encapsulating structure 400.

Since the further logic chip 1900 is completely encapsulated from all sides into the encapsulating structure 400, it is not influenced by the thinning of the electronic chip 100.

Figure 20:
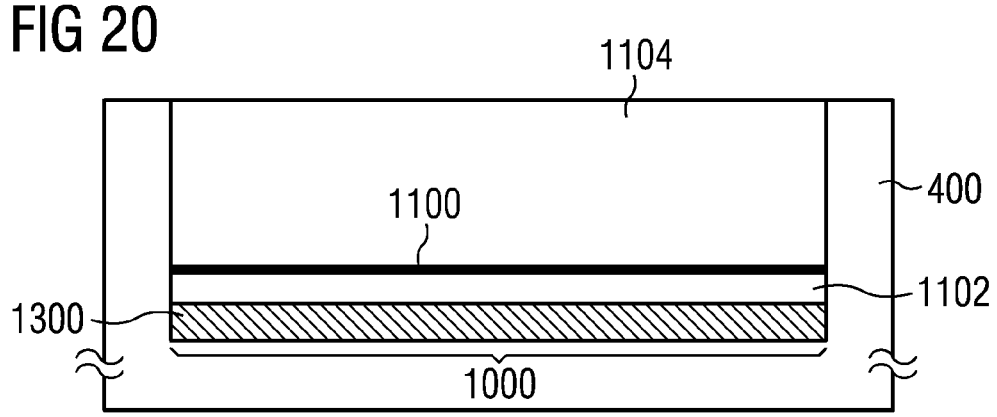
FIG. 20 to FIG. 22 show different structures obtained during carrying out a method of forming thinned encapsulated electronic chips on wafer level according to yet another exemplary embodiment.
Figure 21:
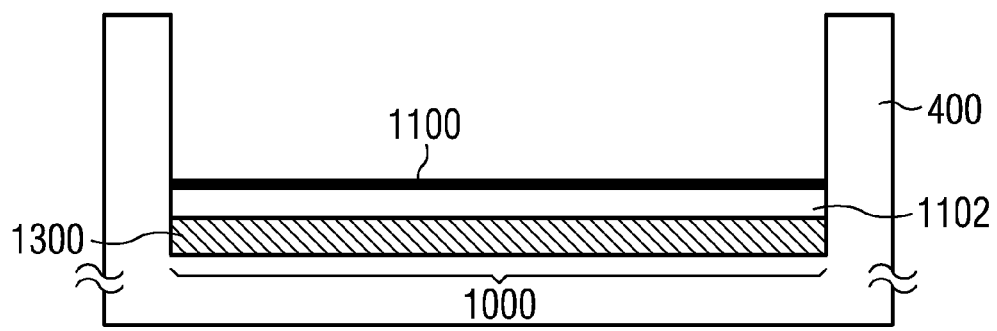
Figure 22:
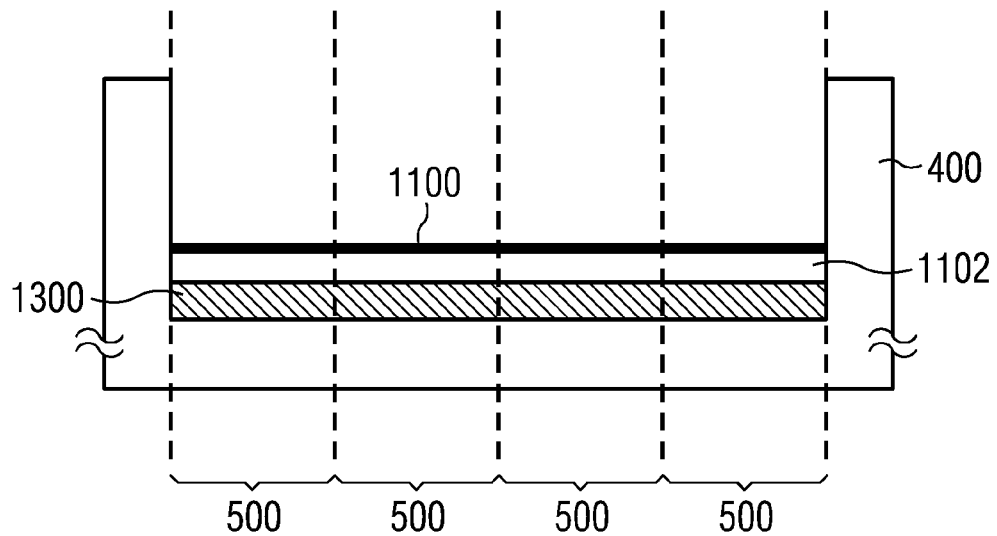

FIG. 20 to FIG. 22 show different structures obtained during carrying out a method of forming thinned encapsulated electronic chips 500 according to another exemplary embodiment.

Referring to FIG. 10 to FIG. 13, the corresponding processes are carried out to obtain the structure shown in FIG. 13 as a starting point for the further processing according to FIG. 20 to FIG. 22. Thus, the wafer 1000 with the buried separation master layer 1100 separating the first wafer body 1102 (with the epitaxially grown additional body 300 in which the integrated circuit elements 1300 are formed) from the second wafer body 1104 is processed on wafer level.

In order to obtain the structure shown in FIG. 20, the wafer 1000 according to FIG. 13 is partially encapsulated in an encapsulating structure 400 so that the second wafer body 1104 is exposed to an environment and the first wafer body 1102 (with the epitaxially grown additional body 300 in which the integrated circuit elements 1300 are formed) is shielded from the environment by the molding or encapsulating structure 400. Compared to FIG. 13, the wafer 1000 is overmolded in an upside down orientation.

In order to obtain the structure shown in FIG. 21, the entire material of the second wafer body 1104 is removed up to but excluding the separation master structure 1100 by a selective etching procedure. During this selective etching procedure, the material removal is performed without substantially removing the encapsulating structure 400 and the separation structure 1100. Thus, the back etching can be performed on wafer level and in package so that no handling of the thinned wafer is necessary.

Although not shown in the figures, it is possible to subsequently remove the separation layer 1100 by a further selective etching procedure which however does not attack material of the encapsulating structure 400 and the wafer material beneath the separation master structure 1100.

In order to obtain the structure shown in FIG. 22, the encapsulated and thinned wafer 1000 shown in FIG. 21 is singularized into the plurality of thinned encapsulated electronic chips 500 each comprising a section of the first wafer body 1102 including at least one integrated circuit element 1300 and a section of the encapsulating structure 400.

If necessary or desired, the thinned encapsulated electronic chips 500 may be further processed subsequently without the necessity to handle thin non-encapsulated electronic chips.

Devices manufactured according to exemplary embodiments can be combined with other devices to form a module or an entire system. For instance, it is possible to combine a logic chip, different electronic power chips, etc.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of forming a thinned encapsulated chip structure, the method comprising:
   forming a separation master structure arranged within a wafer; and
   singularising the wafer with its separation master structure into an electronic chip with its separation structure being formed by a portion of the separation master structure, and into at least one further electronic chip each having a further separation structure being formed by another portion of the separation master structure;
   encapsulating part of the electronic chip by an encapsulating structure;
   thinning selectively the electronic chip partially encapsulated by the encapsulating structure so that the encapsulating structure remains with a larger thickness than the thinned electronic chip, wherein the separation structure functions as a thinning stop.

2. The method according to claim 1, further comprising, before the singularising, forming integrated circuit elements in a portion of the wafer being separated by the separation master structure from another portion of the wafer so that, after the singularising, each of the electronic chip and the at least one further electronic chip comprises at least one of the integrated circuit elements.

3. The method according to claim 2, further comprising, before the forming of the integrated circuit elements, epitaxially growing an additional body to form part of the portion of the wafer being separated by the separation master structure from the other portion of the wafer, wherein the integrated circuit elements are formed at least partially in the additional body.

4. The method according to claim 1, wherein the electronic chip is laterally surrounded by the encapsulating structure and one of two opposing main surfaces of the electronic chip is covered at least partially by the encapsulating structure, whereas the other one of the two opposing main surfaces remains exposed to an environment.

5. The method according to claim 1, wherein the method comprises selectively removing the separation structure after the thinning.

6. The method according to claim 1, wherein the method comprises providing the electronic chip with at least one integrated circuit element in a portion of the electronic chip being separated by the separation structure from another portion of the electronic chip being removed by the thinning.

7. The method according to claim 1, wherein the thinning is performed by back etching material of the electronic chip while using the encapsulating structure as an etch mask.

8. The method according to claim 1, wherein the method further comprises:
   providing a further separation structure arranged within a further electronic chip;
   encapsulating part of the further electronic chip by the encapsulating structure together with the electronic chip; and
   thinning selectively the further electronic chip partially encapsulated by the encapsulating structure together with the electronic chip so that the encapsulating structure remains with a larger thickness than the thinned further electronic chip, wherein the further separation structure functions as a thinning stop.

9. The method according to claim 8, wherein the separation structure and the further separation structure are formed at the same height level.

10. The method according to claim 8, comprising singularising sections each comprising a respective one of the thinned electronic chips encapsulated by a respective portion of the encapsulating structure.

11. A method of forming a thinned encapsulated semiconductor device, the method comprising:
    forming, on a wafer level, a separation layer being formed by a portion of a separation master structure within a semiconductor chip forming part of the wafer so that the separation layer separates a first chip body of the semiconductor chip on one side of the separation layer with regard to a second chip body of the semiconductor chip on the other side of the separation layer;
    forming, on the wafer level, at least one integrated circuit element in and/or on the first chip body;
    singularising the wafer with its separation master structure into the electronic chip with its separation structure being formed by a portion of the separation master structure, and into at least one further electronic chip each having a further separation structure being formed by another portion of the separation master structure;
    encapsulating part of the singularised chip by an encapsulating structure;
    removing selectively the second chip body up to the separation layer so that the encapsulating structure remains with a larger thickness than the first chip body.

12. The method according to claim 11, wherein the first chip body is formed with a thickness of less than 10 µm.

13. The method according to claim 11, wherein the method comprises, on the wafer level, forming an additional body on the first chip body.

* * * * *